United States Patent [19]
Cannella, Jr. et al.

[11] Patent Number: 6,144,561
[45] Date of Patent: Nov. 7, 2000

[54] CONNECTORIZATION PANEL ASSEMBLY FOR CIRCUIT BOARD HOUSING RACK

[75] Inventors: James Eugene Cannella, Jr., Roswell; Tareq K. Hassan, Norcross, both of Ga.; Kamal I. Parikh, Phoenix; Robert A. Saluski, Glendale, both of Ariz.

[73] Assignee: Scientific-Atlanta, Inc., Norcross, Ga.

[21] Appl. No.: 09/204,617

[22] Filed: Dec. 1, 1998

[51] Int. Cl.[7] .................................................. H05K 7/14
[52] U.S. Cl. ........................ 361/796; 361/788; 361/796; 439/62; 439/63
[58] Field of Search .................................... 361/796, 788, 361/801, 825, 683, 685; 439/63, 62, 540.1

[56] References Cited

U.S. PATENT DOCUMENTS

| | | | |
|---|---|---|---|
| 4,573,753 | 3/1986 | Vogl | 339/17 |
| 5,010,450 | 4/1991 | Werdin et al. | 361/801 |
| 5,708,563 | 1/1998 | Cranston, III et al. | 361/683 |
| 5,779,499 | 7/1998 | Settle et al. | 439/540.1 |
| 5,822,184 | 10/1998 | Rabinovitz | 361/685 |

*Primary Examiner*—Jeffrey Gaffin
*Assistant Examiner*—Tuan Dinh
*Attorney, Agent, or Firm*—Kelly A. Gardner; Kenneth M. Massaroni; Hubert J. Barnhardt, III

[57] ABSTRACT

A reconfigurable connectorization panel assembly for a circuit board housing rack or chassis, particularly suitable for use in cable television (CATV) headend equipment. Each circuit module for use in the rack has an associated rear panel assembly or "connectorization panel" that bolts onto the rear side of a chassis which supports the rack and a backplane. The connectorization panels extend plug-action connectors through openings in the rear panel of the chassis and in the backplane, and mate with corresponding connectors on the circuit modules. On the rear side, the connectorization panels provide appropriate drop side connectors required for input/output signal cabling. The connectorization panel adapts a particular slot in the chassis for a particular type of input/out cabling and connectors. The slot can be reconfigured for a different type of circuit module by affixing a different type of connectorization panel.

5 Claims, 7 Drawing Sheets

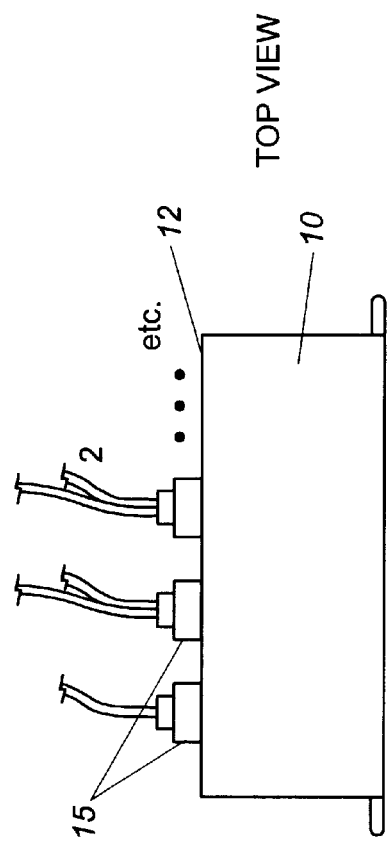
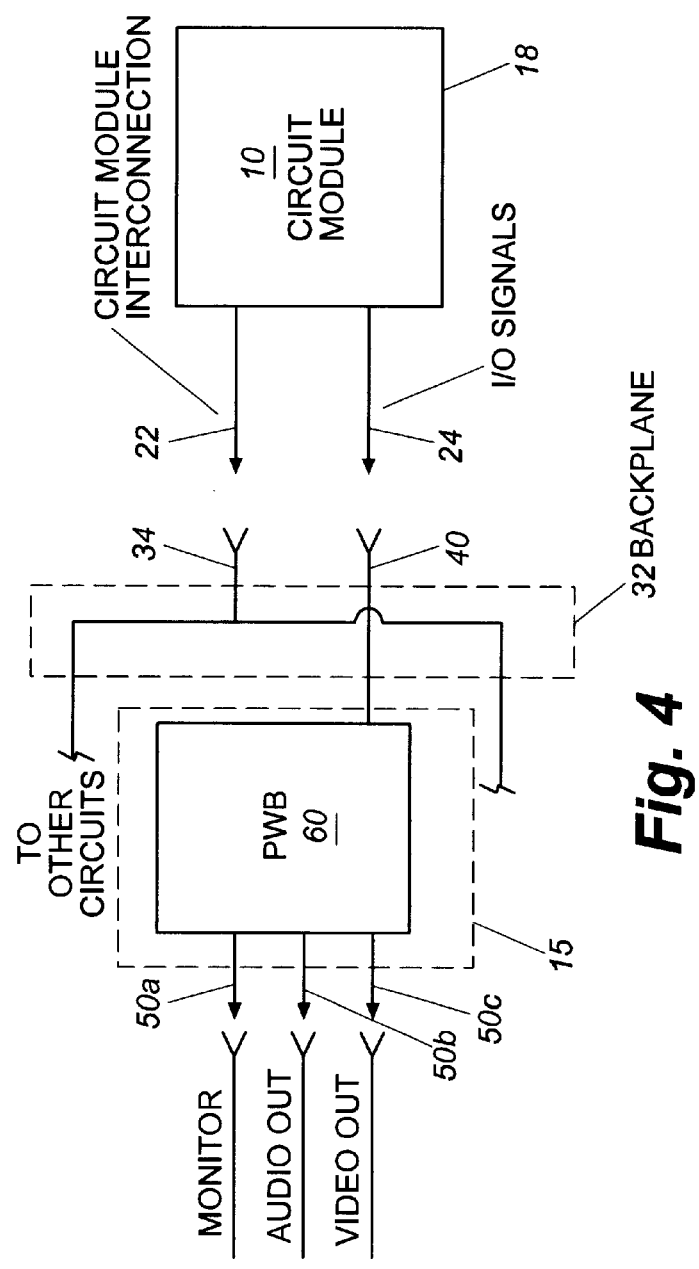

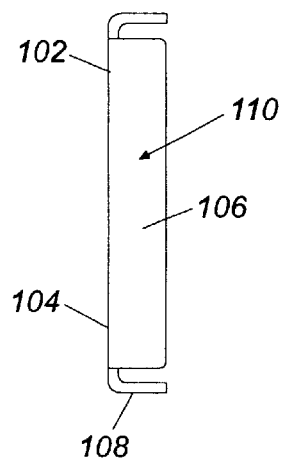 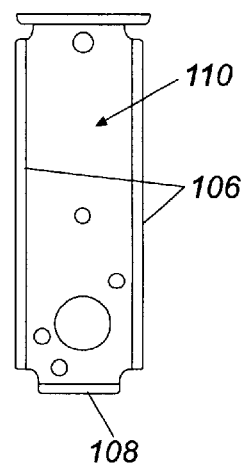
Fig. 8    Fig. 9
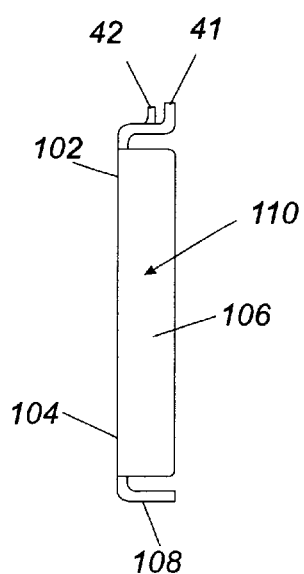 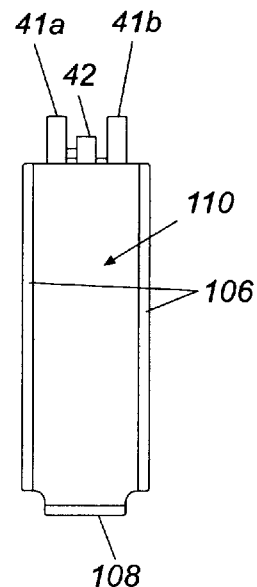
Fig. 11    Fig. 12
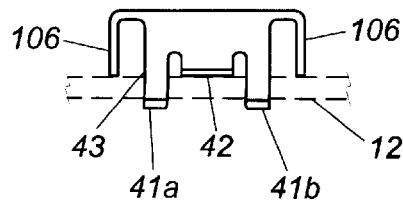
Fig. 13

CONNECTORIZATION PANEL ASSEMBLY FOR CIRCUIT BOARD HOUSING RACK

CROSS REFERENCE TO RELATED APPLICATION

This application is related to application Ser. No. 09/203,068 filed Dec. 1, 1998, assigned to the assignee hereof and entitled "Digital Transport System for Regional Fiber Interconnection of Broadband Networks" to Bender et al., the disclosure of which is incorporated by reference herein and made a part hereof.

TECHNICAL FIELD

The present invention relates generally to connectorization for circuit board mounting racks, and relates more particularly to an assembly for the rear panel of a circuit board housing or rack that allows a particular slot in the rack to be reconfigurably connectorized for plug-action with a particular type of circuit module, with input/output signal cables for that type of circuit module coupled to the assembly rather than directly to the circuit module.

BACKGROUND OF THE INVENTION

Modern electronic systems often employ a number of electronic circuit modules, typically printed wiring boards (PWBs) or printed circuit (PC) cards populated with electronic components and connectors, mounted in an electronic housing or rack. Typical racks often include a plurality of card slots for receiving circuit modules, with card edge guides to hold the cards in alignment, insertion/removal elements, a card connector, and a backplane for providing circuit interconnections. Circuit backplanes are often multilayer printed wiring boards designed for high speed interconnection of signals between different circuit components mounted on physically separated circuit modules in different slots. In most configurations, the circuit modules include electrical connectors affixed to the rear of the circuit module that are plug-action coupled to mating connectors on the backplane.

In some rack configurations, for example those employed in the cable television (CATV) and other telecommunications equipment industries, the circuit modules include discrete drop side signal connectors (electrical and/or optical) affixed to the circuit modules that couple to cables that carry signals to and from the equipment rack. In some of these configurations, the discrete signal connectors are mounted to the rear edge of the circuit modules and extend through openings in and the backplane and the housing rack so as to allow connection of the drop side signal cables. In other configurations, connectors are provided on the front edge of a circuit module to allow for signal insertion and extraction.

Most equipment users would prefer that signals be input and output from the back surface of a card rack, since excessive cabling on the front of a rack clutters the area around the equipment rack, as well as interferes with card insertion and removal. One particular exception to this preference is the provision of optical fiber connectors, which by preference in some industries are provided on the front of circuit boards for ease of cleaning and maintenance.

Circuit board housing racks in some applications are complicated by the need to accommodate different types of circuit modules that effect different types of signal processing. For example, the cable television (CATV) equipment industry has recently been expanding its service offerings to provide services beyond that of the traditional television service. For example, many cable television companies now provide telephone service, local and wide area network (LAN/WAN) data communications service, and Internet service. A modern CATV headend thus serves as a multi-type signal communication hub that allows various types of signals to be input, extracted, or passed through to other signal nodes in the CATV network. These expanded service offerings require handling, of many different types of signals, and insertion and extraction of the signals for communications over the coaxial and optical fiber cable plants.

Telecommunications equipment, especially CATV headend equipment, must now accommodate a wide variety of different types of electronic circuits to handle the adding, dropping, and passing of signals of various types, e.g. baseband video, IF modulated video, S-video, telephone signals, Internet (TCP/IP) traffic, 10 and 100 Base-T network traffic, etc. Prior to communication, these signals must be converted into a format suitable for carrying via the cable or fiber optic plant. Conversely, these signals must be extracted from the coaxial or optical fiber cable and converted into a suitable form for utilization, distribution, further processing, etc. There is therefore need, particularly in the CATV industry, for circuit module racks that can accommodate various circuits and input/out cabling for processing, input, and output of various signal types.

The need to accommodate the wide variety of signal types for input and output complicates the design of the circuit board rack. One approach to the problem of different signal types is the provision of one or more permanently mounted connectors on the back panel of the card rack for connection of the signal cables. This approach is used in the DV6000 digital video transmission system, manufactured by ADC Telecommunications, Inc.

The main problem with this approach is that a card slot becomes "dedicated" to a particular type of circuit module with the provision of a particular connector configuration permanently affixed to the rack back panel. Modern telecommunications equipment must be adaptable and flexible to rapidly changing needs and equipment design. It is not desirable to lock in a particular configuration of an expensive piece of equipment such as a card rack by permanently mounting connectors to the back of the rack.

Another approach to the multi-type signal problem is a circuit module that has a first connector that plugs into a socket in the backplane and has a second type of signal connector that protrudes through an opening in the backplane. Cabling for the card's input/out signals is connected directly to the protruding signal connector.

With this approach, extraction of a card for servicing or replacement in the event of failure becomes a three-step process: First, a technician must access the rear of the enclosure to disconnect the cable from the circuit module. Second, the technician then must return to the front of the enclosure to remove the card. The third step involves a return to the back of the rack to reconnect the cable after a new or repaired card is inserted. Often, the signal cable is left dangling or moved aside during servicing; if care is not taken to label the cable or tie it up in a safe place, confusion and servicing delay can result. The problem is exacerbated if multiple cards are extracted simultaneously, leaving multiple disconnected cables dangling.

Therefore, there is a need in certain electronics equipment configurations, especially those in the CATV equipment industry, for a circuit board rack that allows more ready insertion and extraction of a circuit board module for service, without requiring frequent access to the rear of the equipment rack. Furthermore, there is a need for circuit board rack wherein a particular slot can be connectorized for a particular type of circuit module with its particular types of electrical connectors and cabling, but can be reconfigured in the event of a change in the equipment or type of circuit board that needs to be accommodated in a particular slot.

SUMMARY OF THE INVENTION

Briefly described, the present invention is a reconfigurable rear panel input/output assembly for a circuit board housing rack or chassis. Each circuit module for use in the rack has an associated "connectorization panel" or rear panel assembly that bolts onto the rear side of a chassis that supports the rack and backplane. These connectorization panels extend plug-action connectors through openings in the rear panel of the chassis and in the backplane, and mate with corresponding connectors on the circuit modules. On the rear side, the connectorization panels provide appropriate drop side connectors required for input/output signal cabling.

More particularly described, the present invention provides a rear panel assembly for reconfigurably customizing a slot in an electrical circuit module chassis for particular input/output cabling requirements, where the chassis includes a front for receiving circuit modules and a back panel. The disclosed rear panel assembly comprises a rear panel or connectorization panel assembly housing and a means for removably affixing the housing to the back panel of the circuit module chassis. At least one rear panel assembly first signal connector is provided for coupling to a signal connector on a circuit module mounted in the chassis. The first signal connector is mounted to the rear panel assembly in a position to plug action couple with a circuit module signal connector on the circuit module through an opening in the back panel of the chassis. At least one rear panel assembly second signal connector is mounted to the rear panel assembly in a position to allow coupling to a connector of an external signal cable.

The disclosed assembly may include circuit elements mounted within the connectorization panel assembly for electrically coupling the rear panel assembly first signal connector to the rear panel assembly second signal connector. Such circuit elements may include a printed wiring board mounted within the rear panel assembly with active or passive circuit component.

The present invention finds particular utility in cable television (CATV) equipment, because of the need to provide for many different types of signal inputs and outputs and the need for frequent reconfiguration of the physical housing to accommodate updated or different circuitry with different cabling requirements. Advantageously, a system constructed in accordance with the preferred embodiment of the present invention allows for more convenient adaptation of signal cables to an electrical circuit board rack. By providing different type of signal connectors via the rear panel assembly constructed as described herein, circuit modules can be inserted and removed at will for servicing or replacement, without requiring access to the back panel for disconnection of electrical cables from the card. Furthermore, a particular slot may be readily reconfigured for use with a different type of circuit module by affixing a different type of connectorization panel.

These and other features and advantages of the present invention may be more clearly understood and appreciated from a review of the following detailed description of the disclosed embodiment and by reference to the appended drawings and claims.

BRIEF DESCRIPTION OF THE DRAWINGS

FIG. 3 is a top view of the chassis.

FIG. 4 is an general schematic diagram of the preferred rear panel assembly and chassis.

FIG. 8 is a side view of the preferred rear panel assembly.

FIG. 9 is a front view of the preferred rear panel assembly.

FIG. 11 is a side view of the alternative rear panel assembly.

FIG. 12 is a front view of the alternative rear panel assembly.

FIG. 13 is a top view of the alternative rear panel assembly.

DETAILED DESCRIPTION OF THE DISCLOSED EMBODIMENT

Figure 1:
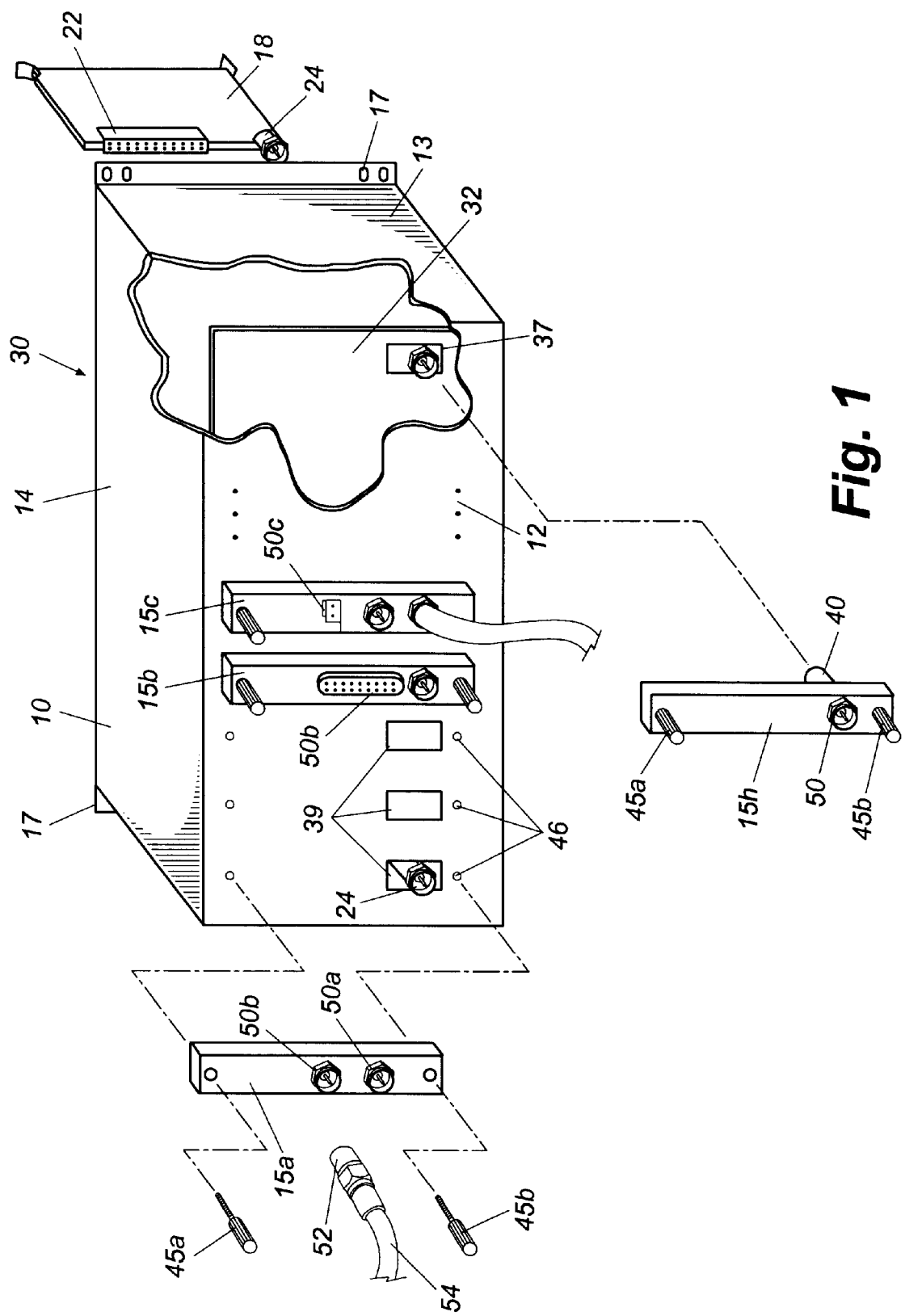
FIG. 1 is an exploded perspective diagram illustrating a rear panel input/output assembly and associated card chassis constructed in accordance with the preferred embodiment of the present invention.

Referring now to the drawings, in which like numerals indicate like components and elements throughout the several views, FIG. 1 illustrates a circuit board housing 10 (also referred to herein alternatively as a rack or chassis) with a rear panel assembly or "connectorization panel" 15 constructed in accordance with the preferred embodiment of the present invention. The rack 10 is viewed from the rear to illustrate application of the invention. The rack 10 includes a back panel 12, side panels 13, and a top 14. Conventional mounting flanges 17 are employed to hold the rack or chassis in position in rack mounting system (not shown), as will be understood by those skilled in the art.

The back panel 12 has affixed thereto a plurality of rear panel input/output assemblies 15, e.g. 15a, 15b, 15c . . . which are employed to customize or configure a particular slot in the rack for receiving a particular type of circuit module and provide appropriate connectors for signal input and output. Two of the rear panel assemblies 15a, 15h are shown removed from their position associated with the chassis 10. Two other assemblies 15b, 15c are shown mounted to the chassis.

The rack 10 is used to house a plurality of circuit modules or cards 18, one of which is shown in FIG. 1. Each of these circuit modules 18 is used to provide an electronic function associated with the rack. For applications involving cable television (CATV) equipment, the circuit modules may conduct signal processing such as conversion of an input baseband video signal to a SONET-compatible digital signal for communication, conversion of a received SONET digital signal to a baseband video signal for output or distribution to system subscribers, input and output of 10 Base-T or 100

Base-T local area network traffic, telephony signals, and the like. However, it will be appreciated that the exact function of the card 18 does not form a part of the present invention, except to the extent that the card requires signals from cables and connectors external to the chassis 10.

The card 18 includes a first module electrical connector 22 for connection of the card to a corresponding connector (not shown in FIG. 1) inside the chassis, and a second module signal connector 24 (electrical or optical fiber) for connection of the card to a corresponding rear panel assembly 15h. For application of the disclosed housing and rear panel assembly for use in the CATV equipment industry, the first module electrical connector 22 is a SIPAC 2.5 mm 4SU multilevel card connector manufactured by Siemens, which allows intercard communications with the backplane at high speed, including and up to 50 and above Mbps. The second module signal connector 24 is typically of a different signal type, for example, a BNC or an RCA-type video connector for provision to a video monitor, a coaxial cable connector for provision of an RF modulated cable television-type signal, or other type of connector for signal input or output to the circuit module 18.

Figure 2:
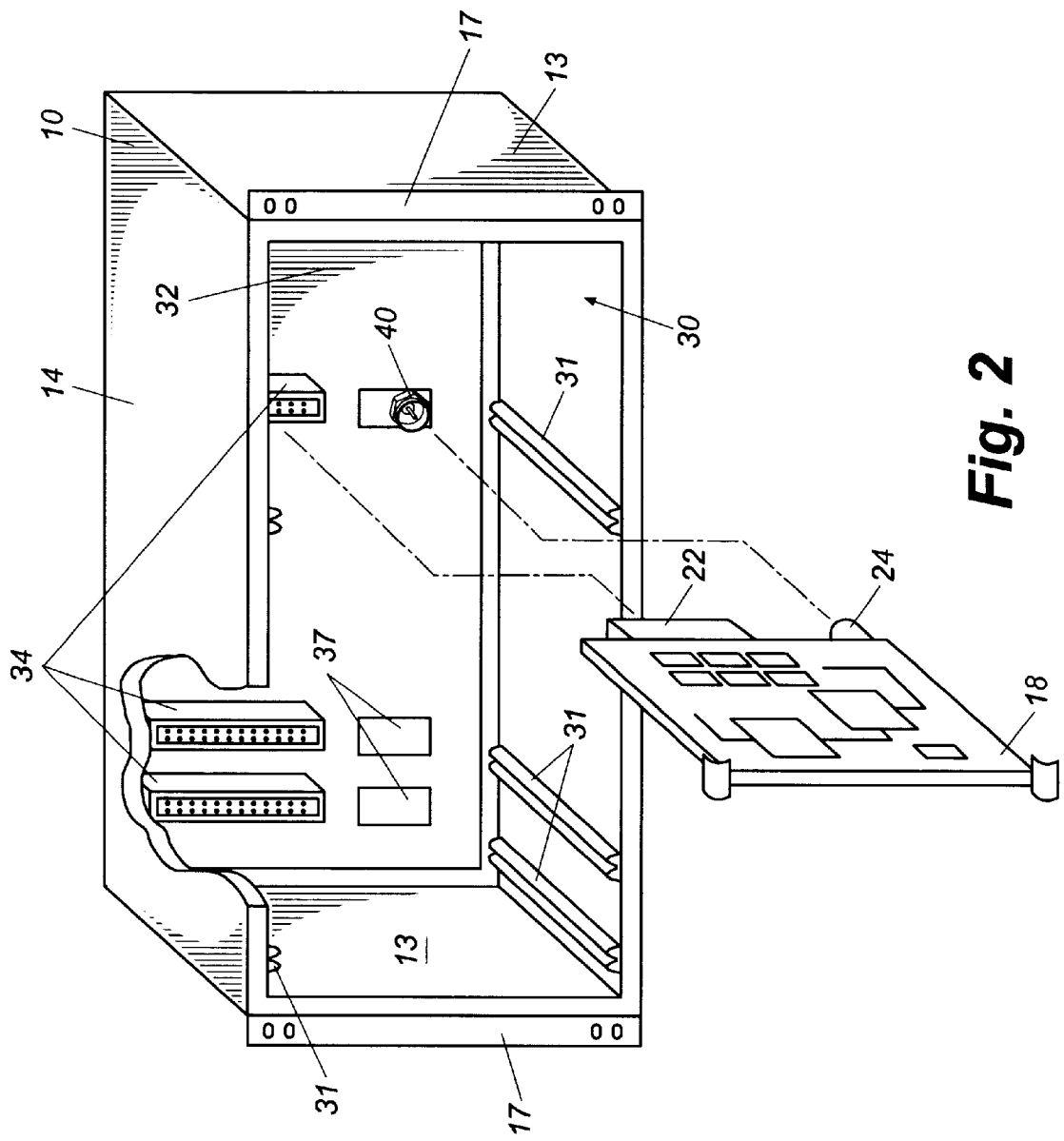
FIG. 2 is a front view of the chassis employed with the rear panel assembly of FIG. 1.

Referring briefly to FIG. 2, the front 30 of the chassis 10 is typically open for removably receiving circuit modules, e.g. card 18. Card edge guides 31 (top and bottom) slidingly receive the top and bottom edges of a circuit module, respectively. A backplane 32 is mounted deep within the enclosure for receiving and mounting circuit modules. The backplane 32 includes a plurality of backplane electrical connectors or card sockets 34 electrically affixed to the backplane for supporting the card 18 and communicating signals between the card(s) and the backplane. The card edge guides 31 hold the card in alignment with the backplane electrical connector 34.

An opening 37 is defined in the backplane for allowing plug action between the second module signal connector 24 on a card 18, and a rear panel assembly first signal connector 40 that is exposed in the opening. A corresponding opening 39 is defined in the back panel 12 of the chassis 10. When the card is seated in its slot, the first module electrical connector 22 is in operative communication with an associated backplane electrical connector 34, and the second module signal connector 24 is in operative communication with an associated rear panel assembly first signal connector 40, through the openings 37, 39.

Referring back to FIG. 1, each of the preferred rear panel assemblies 15 comprises a generally rectangular box-like metal housing. The rear panel assemblies 15 are affixed to the back panel 12 with two captured threaded stud 45a, 45b that are received in threaded openings 46a, 46b to hold the assembly 15 in place. The threaded studs 45 comprise a means for removably affixing the rear panel assembly to the back panel. Other equivalent structure for the removable affixing means includes a threaded stud and tabs that insert into a receiving slot, snap-on type elements, twist knob type fasteners, deformable tabs, press fit housings, and other equivalent devices for removably holding the assembly.

Each rear panel assembly 15 typically includes one or more electrical connectors 50, designated herein as a rear panel assembly second signal connector to distinguish it from the rear panel assembly first signal connection 40 that couples to the card 18. The rear panel assembly second connector 50 is mounted to the rear panel assembly 15 in a position to allow coupling to a connector 52 of a signal cable 54, e.g. a BNC or TNC connector of a coaxial cable.

Each of the rear panel assemblies 15 is custom configured to be operative with a particular type of circuit module 18.

Thus, a card slot in the chassis 10 is "personalized" for a particular type of circuit module by mounting a corresponding rear panel assembly 15 for that particular type of circuit module, the rear panel assembly being provided with appropriate types of connectors associated with that particular circuit module. For example, in FIG. 1 if a circuit module is especially adapted for receiving a baseband input video signal, digitizing that baseband signal, and preparing it for transmission by a broadband medium such as a coaxial cable or optical fiber, then a rear panel assembly such as that at 15a will provide appropriate signal connector 50a that receives an electrical connector 52 of a cable 54 that provides the video signal for input into the system. In some applications, a second one of the rear panel assembly signal connectors, e.g. 50b in FIG. 1 will be provided for coupling to a video monitor, perhaps located a distance from the rack, so that an operator may observe the television content.

In a similar fashion, if one of the circuit modules 18 is configured for transmitting and receiving telephony signals, a different type of electrical connector such as a DTE connector would be employed. For example, a connectorization panel for a DS3 telephony signal may have a single multi-pin connector for making connection to a DS3 circuit board. In this case, a DS3 connectorization panel would preferably include a printed circuit board (PCB) housed within the panel plus multiple PCB10 mounted BNC connectors facing out the back of the connectorization panel. The PCB contains connections between the various connectors.

For redundant DS3s, a connectorization panel may be made double the width of a single slot connectorization panel (not illustrated), with connectors to adjacent DS3 circuit cards in the rack, with wiring on a contained PCB or separately to allow either DS3 card to access the back side mounted BNC connectors.

It will be appreciated that different signal types input and/or output to the circuit modules will require different types of connectors 50, perhaps several different types of connectors on the same assembly.

Although the drawing figures illustrate that the rear panel assembly second signal connector 50 is a coaxial cable type electrical connector, it will be understood that a number of different types of signal connectors (electrical or optical) for connection to a wide variety of input devices, output devices, or communications facilities, can be employed For example, the rear panel assembly 15b shows a D-type electrical connector, 50b, while the assembly 15c shows use of a multi-pin DTE type connector 50c.

FIG. 4 schematically illustrates the electrical connection provided in a system constructed in accordance with the preferred embodiment of the present invention. The circuit module 18 includes the first module electrical connector 22 and the second module signal connector 24 which are received within the backplane electrical connector or card socket 34 and the rear panel assembly first signal connector 40, respectively. Signals from the card socket 34 are communicated to other cards in the backplane via backplane wiring.

The signal received at the rear panel assembly 15 via the rear panel assembly first signal connector 40 is communicated within the rear panel assembly to one or more signal connectors 50 by one or more rear panel assembly second signal connectors 50. An internal printed wiring board (PWB) 60 may be provided within the assembly 15 for providing local signal conditioning, filtering, processing, distribution, or the like. The PWB may do nothing more than split the signal to multiple second signal connectors 50, or may house active and/or passive circuit components.

In the case where the signal from the rear panel assembly first signal connector 40 must be adapted for different types of output via different connectors 50 on the same rear panel assembly, the PWB 60 may contain active and/or passive circuit components for this function. The PWB 60 thus serves as an interface between the signal on the rear panel assembly first signal connector 40 and one or more rear panel assembly second signal connector(s) 50.

For example, it may be necessary or desirable to process the signal on line 40 internally of the rear panel assembly 15 as a part of the adaptation and/or monitoring of the signals. As shown in FIG. 4, if the circuit module 18 is a video signal processing circuit operative to provide a baseband video output signal and separate audio output signals, and the system operator wishes to monitor the video output signals, three separate rear panel assembly second signal connectors 50a, 50b, 50c can be provided: one connector 50a for a signal MONITOR provided to a video monitor, one connector 50b for audio output signals designated AUDIOOUT, and one connector 50c for the signal VIDEO OUT that is the primary output signal of the circuit module.

In this particular example, three separate and different types of signal connectors are provided on the rear panel assembly 15, and three separate mating connectors and cable are connected to the rear panel assembly.

Figure 5:
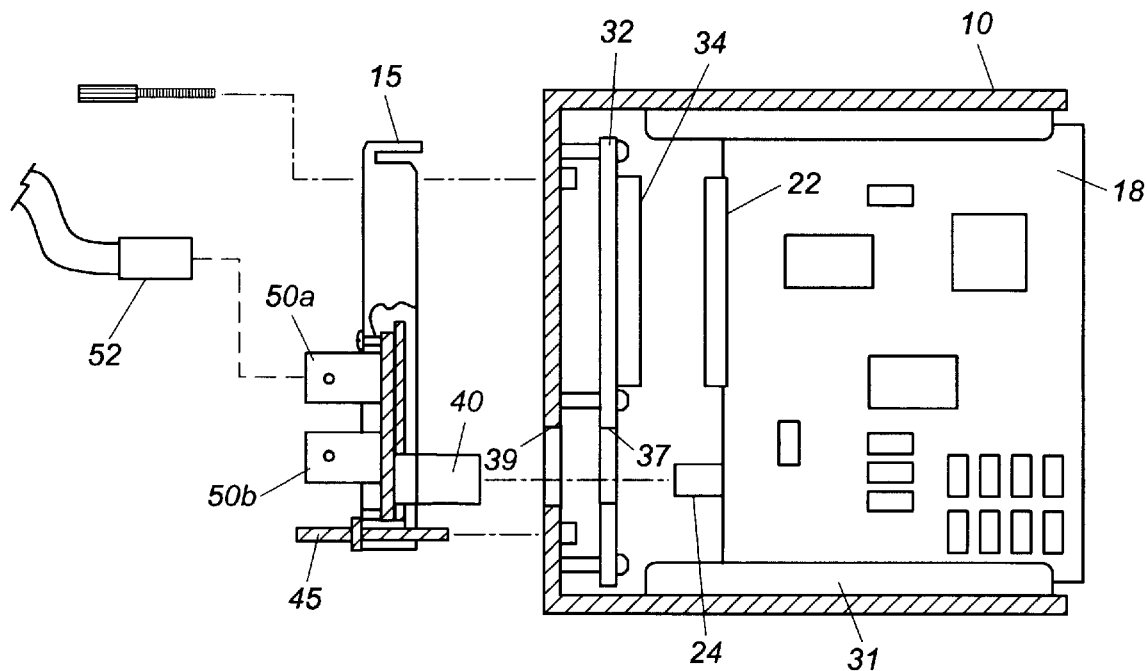
FIG. 5 is an cross-sectional side view of the rear panel assembly and chassis, disassembled.
Figure 6:
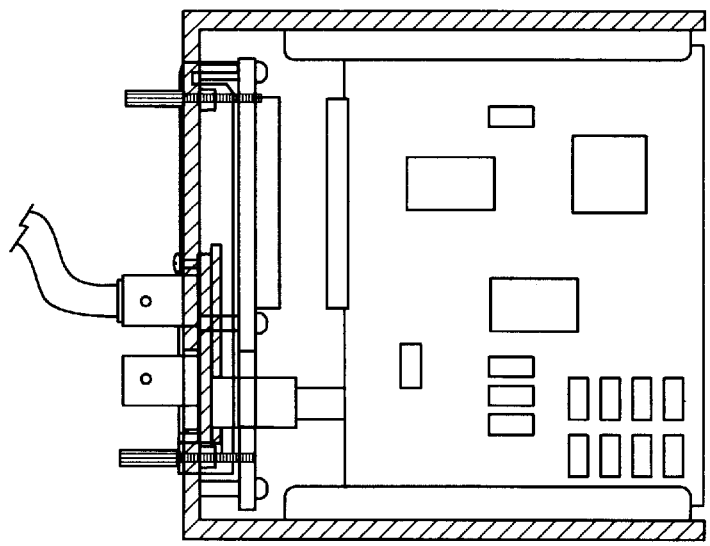
FIG. 6 is a cross-sectional side view of the rear panel assembly and chassis, assembled.

FIGS. 5 and 6, taken together, illustrate the various elements of the preferred embodiment of the present invention, with FIG. 5 illustrating the various components in a disassembled fashion, while FIG. 6 illustrates a component in an assembled fashion with a rear panel assembly 15 in place.

Figure 7:
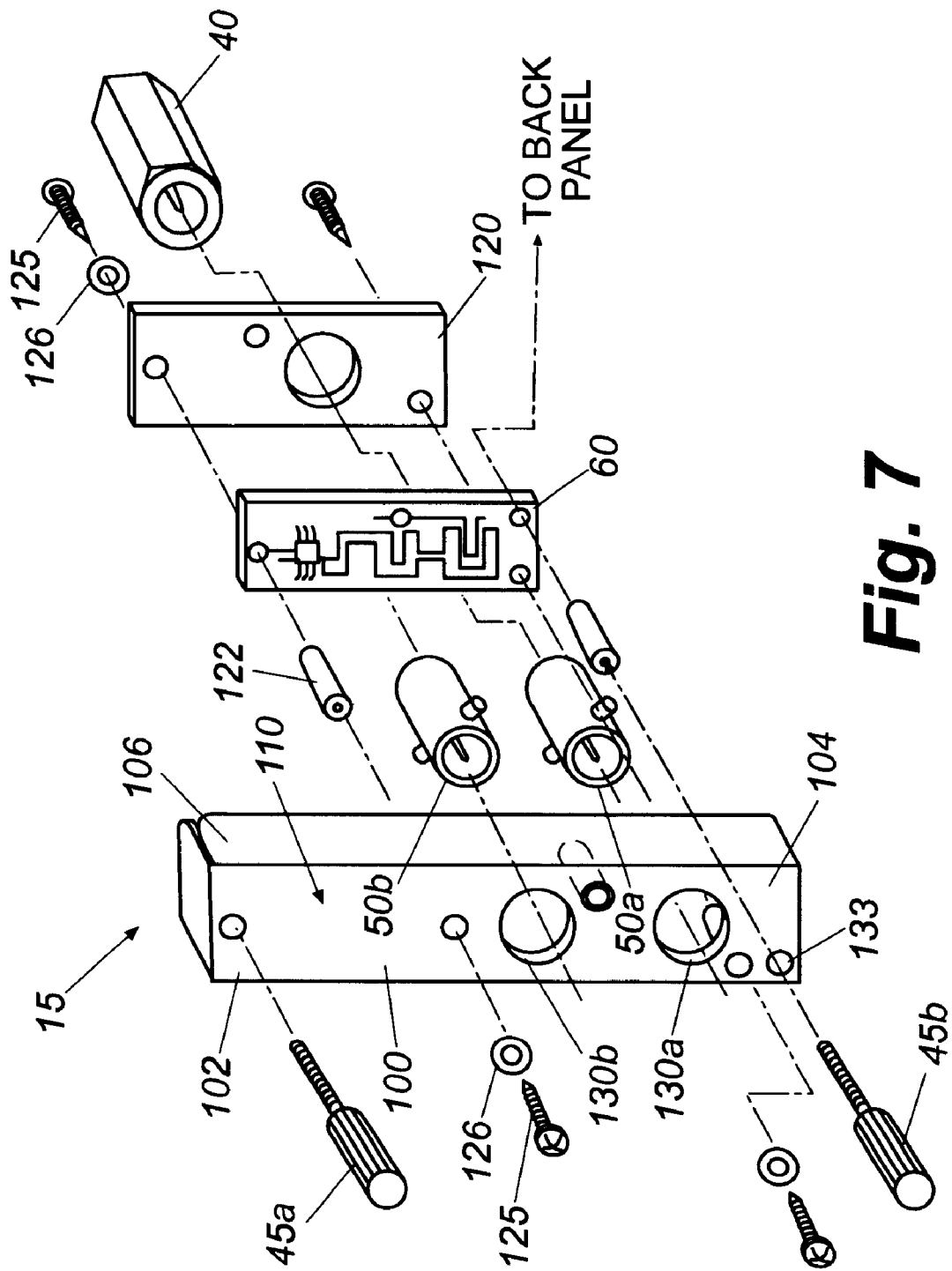
FIG. 7 is an exploded view of the preferred rear panel assembly.
Figure 10:
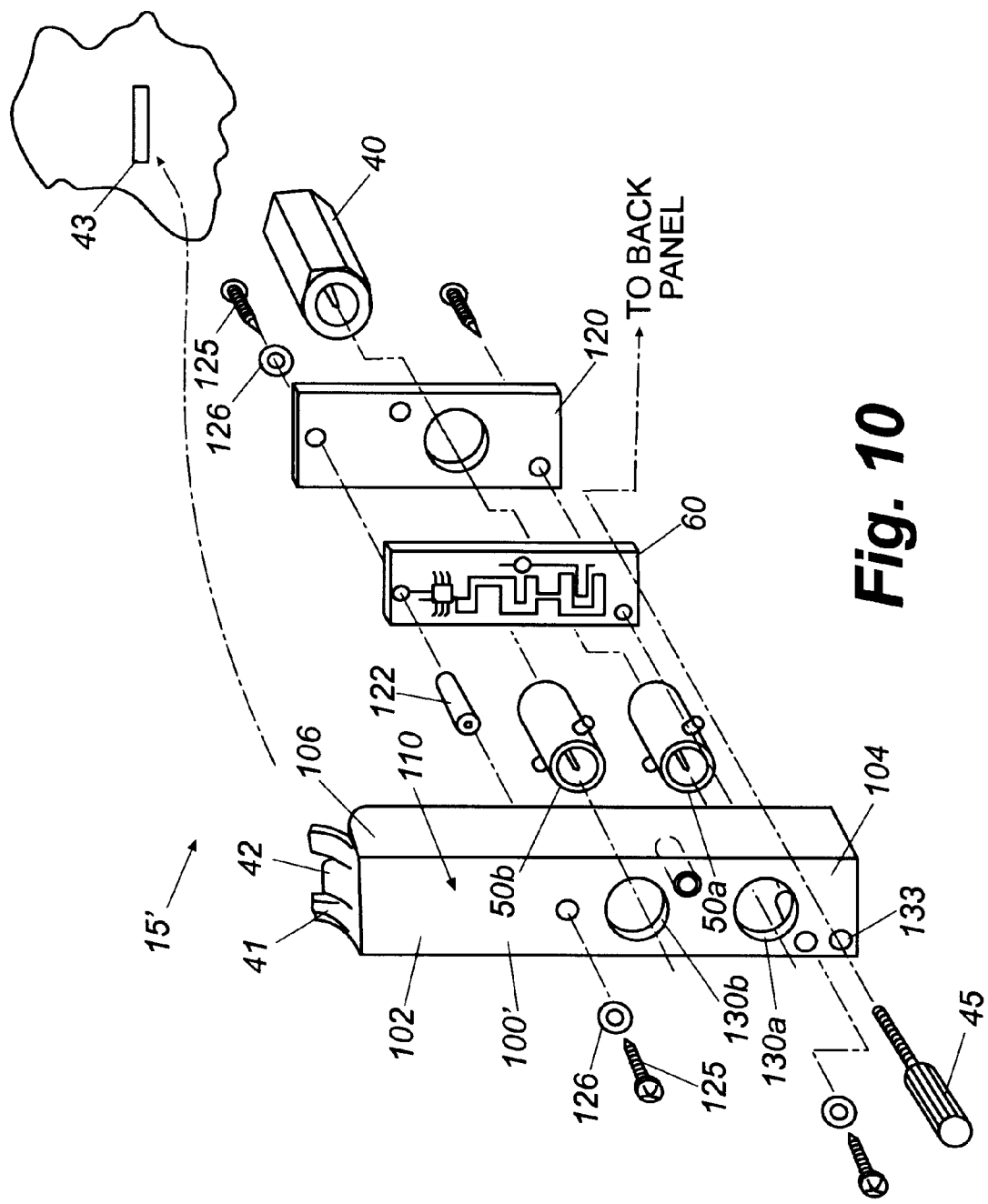
FIG. 10 is an exploded view of an alternative embodiment of the rear panel assembly.

FIG. 7 illustrates an exemplary rear panel assembly 15 constructed in accordance with the preferred embodiment of the present invention, exploded to illustrate the various components. The rear panel assembly 15 comprises a rear panel assembly housing 100, typically made of metal which is cut and bent to form a generally rectangular housing with an upper end 102 and a lower end 104. The housing 100 further comprises sides 106 and a lower panel 108 defining an enclosed region 110.

The rear panel assembly 15 houses and encloses a connector support plate 120, which in turns supports the rear panel assembly first signal connector 40. In one embodiment, the rear panel assembly first signal connector 40 is a BNC-to-BNC coaxial connector such as a BNC twist-on RG58 coaxial cable connector. Those skilled in the art will appreciate that this type of connector provides an RF signal connection that on one side provides a twist on RF connector for a BNC connector while the other end provides a corresponding RF slot end adapter.

The example assembly 15 shown in FIG. 7 is configured for providing a plurality of RF signal connectors 50a, 50b as the rear panel assembly second signal connectors. In order to construct such a configuration, the printed wiring board 60 is employed for splitting the signal received from the rear panel assembly first signal connector 40 and providing it to the two separate second signal connectors 50a, 50b.

The printed wiring board 60 is mounted within the enclosed region 106, protected and covered by the connector support plate 120. The PWB 60 and connector support plate 120 are supported within the enclosed region 110 by a plurality of threaded standoffs 122 which hold the PWB and support plate in a spaced-apart relation from the housing 100. Screws 125 and washers 126 are used to fasten the standoffs 122 to the housing 100 and then attach the connector support plate 120 and rear assembly PWB 60 to the standoffs.

The rear panel assembly second signal connectors 50a, 50b are soldered or otherwise attached to the PWB 60 and extend through openings 130a, 130b, respectively, in the housing 100. The captured threaded stud 45 extends through an opening 133 provided in a lower corner on the lower end 104 of the housing 100.

Although the PWB 60 shown in FIG. 7 illustrates the notion of separating the signal within the rear panel assembly 15 into two separate signals for the connectors 50a, 50b, it will be understood that the PWB can include active circuit components such as integrated circuits as well as passive components such as resistor, capacitors, etc. where signal conditioning, filtering, level adjustments, and other types of signal processing must be effected prior to input or output of a signal.

Referring to FIGS. 7, 8, and 9, the rear panel assembly housing 100 includes a pair of captured threaded fasteners 45a, 45b for holding the assembly onto the back panel of the chassis. Preferably, one threaded fastener is positioned at the upper end 102 and another fastener is positioned at the lower end 104.

FIGS. 10, 11, 12 and 13 illustrate an alternative embodiment of the rear panel assembly 15', with an alternative manner for affixing a housing 100'. The alternative embodiment includes at least one insertable tab 41 and at least one exterior retaining tab 42 for positioning the assembly onto the back panel 12 of the chassis 10. Preferably, a pair of insertable tabs 41a, 41b are positioned on each side of a central exterior retaining tab 42. These tabs are all of a general S-shape formed by bending the metal of the housing 100'. The insertable tab(s) 41 are received within a slot 43 in the back panel 12. The insertable tabs 41 are thus positioned within the rack 10, while the retaining tab 42 rests against the outside of the back panel 12 and holds the assembly in place. A single threaded stud 45 then is used to screw the assembly in place.

From the foregoing, it will be understood and appreciated that the present invention provides a removable and reconfigurable "connectorization panel" assembly that allows for more convenient adaptation of signal cables to an electrical circuit board rack. By providing different type of signal connectors via a rear panel assembly 15 constructed as described herein, circuit modules such as those shown at 18 can be inserted and removed at will for servicing, without requiring access to the back panel for disconnection of electrical cables from the card. A particular slot may be readily reconfigured for use with a different type of circuit module by affixing a different type of connectorization panel. Accordingly, the present invention finds particular utility in cable television (CATV) equipment, because of the need to provide for many different types of signal inputs and outputs and the need for frequent reconfiguration of the physical housing to accommodate updated or different circuitry with different cabling requirements.

In view of the foregoing description of the preferred embodiments of the present invention, other embodiments will suggest themselves to those skilled in the alt. Therefore, the scope of the present invention is to be limited only by the claims set forth below.

What is claimed is:

1. A rear panel assembly for reconfigurably customizing a slot in an electrical circuit module chassis for particular input/output cabling requirements, the electrical circuit module chassis including a front for receiving circuit modules and a back panel, the rear panel assembly comprising;

a rear panel assembly housing;

means for removably affixing the rear panel assembly housing to the back panel of the circuit module chassis;

at least one rear panel assembly first signal connector for coupling to a signal connector on a circuit module mounted in the chassis, the rear panel assembly first signal connector being mounted to the rear panel assembly in a position to plug action couple with a circuit module signal connector on said circuit module through an opening in the back panel of the chassis; and at least one rear panel assembly second signal connector mounted to the rear panel assembly in a position to allow coupling to a connector of an external signal cable, wherein the rear panel assembly is mounted on the back panel to thereby permit said circuit module to be plug in coupled to and removed from the rear panel assembly first signal connector without removal of the rear panel assembly from the back panel, and wherein proper insertion of said circuit module into the electrical circuit module chassis plug-in couples the circuit module signal connector of the circuit module to the rear panel assembly first signal connector.

2. The rear panel assembly of claim 1, further comprising circuit elements mounted within the rear panel assembly for electrically coupling the rear panel assembly first signal connector to the rear panel assembly second signal connector.

3. The rear panel assembly of claim 1, wherein the circuit elements comprise a printed wiring board mounted within the rear panel assembly.

4. A system for mounting a plurality of electrical circuit modules, each of the electrical circuit modules including a first module electrical connector and a second module signal connector, comprising:

a circuit module chassis having an opening for insertion of circuit modules into module slots and a back panel;

a signal backplane affixed within said circuit module chassis, proximate to said back panel, the backplane connecting the various circuit modules for electrical signal communications;

at least one backplane electrical connector configured to plug action mate to the first module electrical connector and mounted to the signal backplane for receiving the first module electrical connector of a circuit module and electrically coupling the circuit module to the signal backplane;

an opening defined in the backplane for receiving the second module signal connector and allowing access to the second module signal connector via the rear of the circuit module chassis;

at least one selectably removable rear panel assembly mounted to the back panel in a position aligned with the second module signal connector of a circuit module associated with one of the first backplane electrical connectors, the rear panel assembly comprising:

at least one rear panel assembly first signal connector for plug-action electrically coupling to the second module signal connector, wherein the first signal connector is mounted to the rear panel assembly in a position to mate with a second module signal connector of a circuit module mounted in the circuit module enclosure through the openings in the back panel and in the backplane, wherein the circuit module, via the second module signal connector and the rear panel assembly first signal connector, can be plugged into and detached from the rear panel assembly while the rear panel assembly remains affixed to the back panel, and wherein proper insertion of the circuit module into the circuit module chassis plug-in couples the second module signal connector to the rear panel assembly first signal connector; and at least one rear panel assembly second signal connector mounted to the rear panel assembly in a position to allow coupling to a connector of an external signal cable, whereby a module slot in the circuit module enclosure is reconfigurably customized for a particular type of circuit module having a particular arrangement and/or type of second module electrical connectors by use of a particular configuration of rear panel assembly.

5. The system of claim 4, wherein the rear panel assembly comprises circuit elements mounted within the rear panel assembly for electrically coupling the rear panel assembly first signal connector to the rear panel assembly second signal connector.

* * * * *

UNITED STATES PATENT AND TRADEMARK OFFICE
CERTIFICATE OF CORRECTION

PATENT NO : 6,144,561
DATED : NOVEMBER 7, 2000
INVENTOR(S) : CANNELLA ET AL.

It is certified that error appears in the above-identified patent and that said Letters Patent is hereby corrected as shown below:

Column 2, Line 11, delete "handling, of" and insert therefore - handling of -
Column 6, Line 26, delete "PCB10 mounted" and insert therefore - PCB-mounted"
Column 7, Line 22, delete "AUDIOOUT" and insert therefore - AUDIO OUT -
Column 8, Line 8, delete "comer" and insert therefore - corner -
Column 8, Line 61, delete "alt" and insert therefore - art -

Signed and Sealed this

Eighth Day of May, 2001

*Attest:*

NICHOLAS P. GODICI

*Attesting Officer*     Acting Director of the United States Patent and Trademark Office